United States Patent
Xie et al.

(10) Patent No.: US 11,158,657 B2
(45) Date of Patent: Oct. 26, 2021

(54) RAY DETECTOR ARRAY SUBSTRATE, MANUFACTURING METHOD THEREOF, AND RAY DETECTOR

(71) Applicants: BEIJING BOE OPTOELECTRONICS TECHNOLOGY CO., LTD., Beijing (CN); BOE TECHNOLOGY GROUP CO., LTD., Beijing (CN)

(72) Inventors: Zhenyu Xie, Beijing (CN); Lijun Mao, Beijing (CN); Tiansheng Li, Beijing (CN)

(73) Assignees: BEIJING BOE OPTOELECTRONICS TECHNOLOGY CO., LTD., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 64 days.

(21) Appl. No.: 16/641,979

(22) PCT Filed: Apr. 24, 2019

(86) PCT No.: PCT/CN2019/084061
§ 371 (c)(1),
(2) Date: Feb. 25, 2020

(87) PCT Pub. No.: WO2019/214435
PCT Pub. Date: Nov. 14, 2019

(65) Prior Publication Data
US 2020/0219917 A1 Jul. 9, 2020

(30) Foreign Application Priority Data
May 7, 2018 (CN) .......................... 201810427616.5

(51) Int. Cl.
*H01L 27/146* (2006.01)
*H01L 29/786* (2006.01)

(52) U.S. Cl.
CPC .... *H01L 27/14612* (2013.01); *H01L 27/1462* (2013.01); *H01L 27/14636* (2013.01); *H01L 27/14689* (2013.01); *H01L 29/78669* (2013.01)

(58) Field of Classification Search
CPC ........... H01L 27/14612; H01L 27/1462; H01L 27/14636; H01L 27/14689;
(Continued)

(56) References Cited

U.S. PATENT DOCUMENTS

2003/0199117 A1   10/2003   Kwon
2009/0146147 A1    6/2009   Kim
(Continued)

FOREIGN PATENT DOCUMENTS

CN    203085544 U     7/2013
CN    103474474 A    12/2013
(Continued)

OTHER PUBLICATIONS

International Search Report received for PCT Patent Application No. PCT/CN2019/084061, dated Jul. 24, 2019, 5 pages (2 pages of English Translation and 3 pages of Original Document).
Office Action received for Chinese Patent Application No. 201810427616.5, dated Mar. 13, 2020, 9 pages (4 pages of English Translation and 5 pages of Office Action).

*Primary Examiner* — Edward Chin
(74) *Attorney, Agent, or Firm* — Womble Bond Dickinson (US) LLP (57) ABSTRACT

A method for manufacturing a ray detector array substrate is provided, comprising: forming a thin film transistor, a first data line and a receiving electrode on a base substrate; forming a first passivation layer on the base substrate; forming a first via hole and a second via hole in regions of
(Continued)

the first passivation layer corresponding to the first data line and the receiving electrode, respectively; forming a photoelectric conversion layer covering the first passivation layer on the base substrate, the first via hole and the second via hole being filled with a material of the photoelectric conversion layer; etching the photoelectric conversion layer to retain a first portion of the photoelectric conversion layer inside the first via hole, and a second portion of the photoelectric conversion layer above and corresponding to the second via hole.

18 Claims, 7 Drawing Sheets

(58) Field of Classification Search
CPC ......... H01L 29/78669; H01L 27/14692; H01L 27/14658
See application file for complete search history.

(56) References Cited

U.S. PATENT DOCUMENTS

| | | |
|---|---|---|
| 2016/0247835 A1 | 8/2016 | Jiang et al. |
| 2017/0186809 A1 | 6/2017 | Gao et al. |
| 2017/0236857 A1* | 8/2017 | Bu .................... H01L 27/14689 438/80 |
| 2020/0219917 A1 | 7/2020 | Xie et al. |

FOREIGN PATENT DOCUMENTS

| | | |
|---|---|---|
| CN | 104241296 A | 12/2014 |
| CN | 104900669 A | 9/2015 |
| CN | 106876415 A | 6/2017 |
| CN | 107623011 A | 1/2018 |
| CN | 108550595 A | 9/2018 |

* cited by examiner

RAY DETECTOR ARRAY SUBSTRATE, MANUFACTURING METHOD THEREOF, AND RAY DETECTOR

RELATED APPLICATION

The present application is a 35 U.S.C. 371 national stage application of a PCT International Application No. PCT/CN2019/084061, filed on Apr. 24, 2019, which claims the benefit of Chinese Patent Application No. 201810427616.5, filed with the Chinese Patent Office on May 7, 2018, the entire disclosure of which is incorporated herein by reference.

TECHNICAL FIELD

The present disclosure relates to the field of detector technologies, especially to a ray detector array substrate, a manufacturing method thereof, and a ray detector.

BACKGROUND

With the development of society and the continuous progress in science and technology, various types of ray detectors have gradually been widely applied in medical imaging, industrial manufacturing and other fields. The array substrate is one of the important components of a ray detector.

At present, the array substrate of a ray detector is prone to being overly etched during the manufacturing process.

SUMMARY

An embodiment of the disclosure provides a method for manufacturing a ray detector array substrate, comprising: forming a thin film transistor, a first data line and a receiving electrode on a base substrate, the first data line and the receiving electrode being electrically connected to a source or a drain of the thin film transistor, respectively; forming a first passivation layer on the base substrate, the first passivation layer covering the thin film transistor, the first data line, and the receiving electrode; forming a first via hole and a second via hole in regions of the first passivation layer corresponding to the first data line and the receiving electrode, respectively; forming a photoelectric conversion layer covering the first passivation layer on the base substrate, the first via hole and the second via hole being filled with a material of the photoelectric conversion layer; etching the photoelectric conversion layer to retain a first portion of the photoelectric conversion layer inside the first via hole, and a second portion of the photoelectric conversion layer above and corresponding to the second via hole.

In some embodiments, the method for manufacturing a ray detector array substrate further comprise: forming a first conductive layer on the second portion of the photoelectric conversion layer; forming a resin layer and a second passivation layer successively, the resin layer and the second passivation layer covering the first conductive layer, the first passivation layer, and the first portion of the photoelectric conversion layer; etching the resin layer and the second passivation layer to form a third via hole above the first via hole, and form a fourth via hole above the second via hole, the third via hole exposing the first portion of the photoelectric conversion layer in the first via hole, and the fourth via hole exposing at least a portion of the first conductive layer.

In some embodiments, the etching the photoelectric conversion layer to retain the first portion of the photoelectric conversion layer inside the first via hole, and a second portion of the photoelectric conversion layer above and corresponding to the second via hole comprises: forming, on the photoelectric conversion layer covering the first passivation layer, a first photoresist sub-layer having a first thickness and a second photoresist sub-layer having a second thickness, respectively, the second thickness being greater than the first thickness, the first photoresist sub-layer corresponding to the first via hole, the second photoresist sub-layer corresponding to the second via hole; etching regions of the photoelectric conversion layer not covered by the first photoresist sub-layer and the second photoresist sub-layer, so that a thickness of the photoelectric conversion layer in the regions is reduced by a preset value; performing ashing treatment on the first photoresist sub-layer and the second photoresist sub-layer to remove the first photoresist sub-layer and reduce a thickness of the second photoresist sub-layer, and etching the photoelectric conversion layer outside the second photoresist sub-layer at a same etching rate to only retain the first portion of the photoelectric conversion layer inside the first via hole.

In some embodiments, the forming the first photoresist sub-layer having the first thickness and the second photoresist sub-layer having the second thickness comprises: forming a photoresist layer with a uniform thickness on the photoelectric conversion layer covering the first passivation layer, the photoresist layer covering the photoelectric conversion layer, and performing a half-tone mask exposure process on the photoresist layer to form the first photoresist sub-layer above the first via hole, and form the second photoresist sub-layer above the second via hole.

In some embodiments, the preset thickness is $\frac{1}{3}$ of a thickness of the photoelectric conversion layer.

In some embodiments, the method for manufacturing a ray detector array substrate further comprise: forming a second data line, a light shielding layer and a shielding electrode on the second passivation layer, the second data line being electrically connected to the first portion of the photoelectric conversion layer through the third via hole, the light shielding layer corresponding to an active layer of the thin film transistor, the shielding electrode being electrically connected to the first conductive layer through the fourth via hole; forming a third passivation layer, the third passivation layer covering the second passivation layer on which the second data line, the light shielding layer, and the shielding electrode have been formed; forming a fifth via hole in the third passivation layer, the fifth via hole exposing at least a part of the shielding electrode, and forming a second conductive layer on the third passivation layer, the second conductive layer being connected to the shielding electrode through the fifth via hole.

In some embodiments, the forming the photoelectric conversion layer covering the first passivation layer on the base substrate comprises: forming N-type amorphous silicon, I-type amorphous silicon, and P-type amorphous silicon successively on the first passivation layer, the first via hole and the second via hole being filled with the N-type amorphous silicon.

Another embodiment of the disclosure provides a ray detector array substrate comprising: a base substrate, and a thin film transistor, a first data line, and a receiving electrode on the base substrate, the first data line and the receiving electrode being electrically connected to a source or a drain of the thin film transistor, respectively; a first passivation layer disposed on the base substrate and covering the thin film transistor, the first passivation layer comprising a first via hole and a second via hole, the first via hole corresponding to a region of the first data line, the second via hole corresponding to a region of the receiving electrode, and a photoelectric conversion layer, the photoelectric conversion layer comprising a first portion in the first via hole and a second portion in the second via hole, the first portion being electrically connected to the first data line, the second portion being electrically connected to the receiving electrode.

In some embodiments, the ray detector array substrate further comprises: a first conductive layer disposed on a side of the second portion of the photoelectric conversion layer facing away the receiving electrode; a resin layer covering the first conductive layer, the first passivation layer and the first portion of the photoelectric conversion layer, and a second passivation layer above the resin layer. The resin layer and the second passivation layer comprise a third via hole and a fourth via hole, the third via hole penetrating to the first portion of the photoelectric conversion layer in a thickness direction of the resin layer, the fourth via hole penetrating to the first conductive layer in the thickness direction of the resin layer.

In some embodiments, the ray detector array substrate further comprises: a second data line, a light shielding layer and a shielding electrode disposed on the second passivation layer, the second data line being electrically connected to the first portion of the photoelectric conversion layer through the third via hole, the light shielding layer corresponding to an active layer of the thin film transistor, the shielding electrode being electrically connected to the first conductive layer through the fourth via hole; a third passivation layer, the third passivation layer covering the second passivation layer, and the second data line, the light shielding layer and the shielding electrode on the second passivation layer, the third passivation layer comprises a fifth via hole, and a second conductive layer, the second conductive layer being electrically connected to the shielding electrode through the fifth via hole.

In some embodiments, the photoelectric conversion layer comprises N-type amorphous silicon, I-type amorphous and P-type amorphous silicon disposed on the first passivation layer successively, and the first portion of the photoelectric conversion layer comprises the N-type amorphous silicon.

In some embodiments, the resin layer is adhered to the first passivation layer and the first conductive layer through a resin adhesive layer.

A further embodiment of the disclosure provides a ray detector, comprising the ray detector array substrate according to any one of the foregoing embodiments.

Yet another embodiment of the present disclosure provides a ray detector array substrate which is manufactured by any of the methods of manufacturing a ray detector array substrate described above.

DETAILED DESCRIPTION OF EMBODIMENTS

The technical solutions in embodiments of the disclosure will be clearly and completely described below in connection with the accompanying drawings. The described embodiments are only a part of the embodiments of the disclosure, rather all of them. Based on the embodiments herein, all other embodiments obtained by those ordinarily skilled in the art without inventive efforts fall within the protection scope of the present application.

Figure 1:
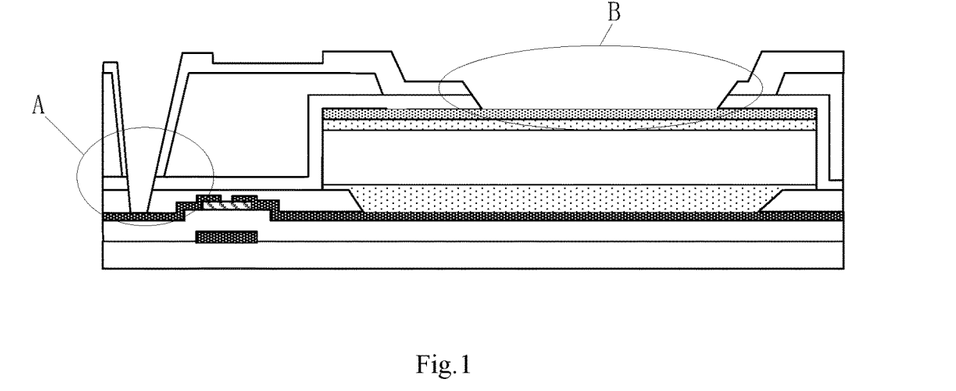
FIG. 1 illustrates a partial sectional view of a ray detector array substrate in a manufacturing process according to an embodiment of the present disclosure.

FIG. 1 illustrates a partial sectional view of a ray detector array substrate in a manufacturing process according to an embodiment of the disclosure. As shown in FIG. 1, when a via hole is being formed, over-etching is likely to occur at the position indicated with "A".

Figure 2:
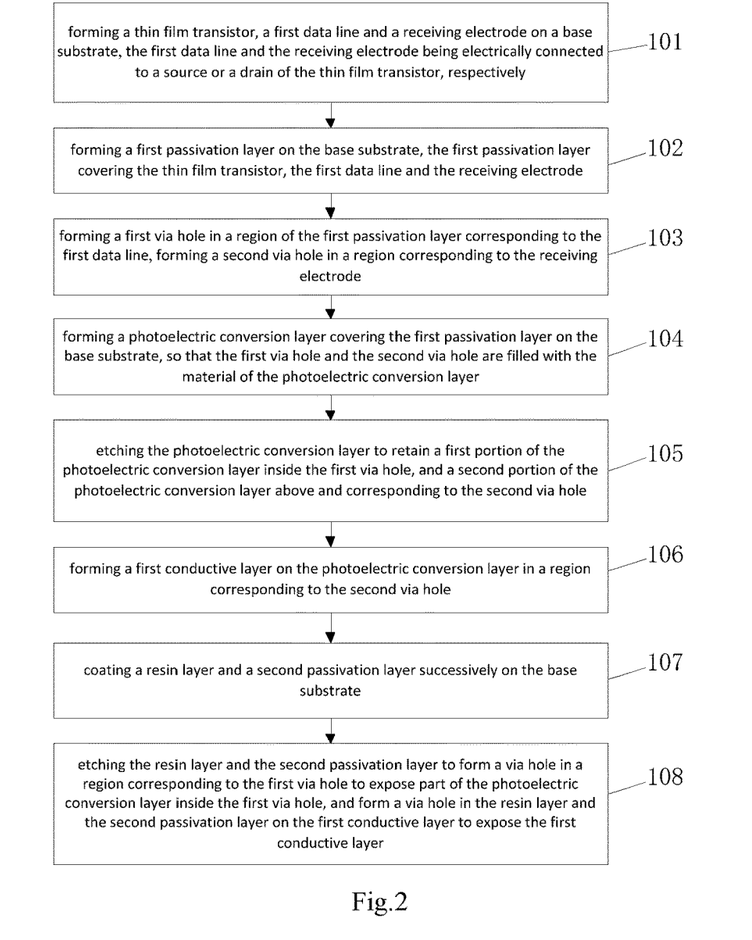
FIG. 2 is a flow chart of a method for manufacturing a ray detector array substrate according to an embodiment of the present disclosure.

FIG. 2 illustrates a method of manufacturing a ray detector array substrate according to an embodiment of the disclosure. The methods described in the embodiments of the disclosure are applicable to various types of ray detectors, including but not limited to X-ray detectors. As shown in FIG. 2, an embodiment of the present disclosure provides a method of manufacturing a ray detector array substrate, the method comprises the following steps.

101. Forming a thin film transistor, a first data line and a receiving electrode on a base substrate, the first data line and the receiving electrode being electrically connected to a source or a drain of the thin film transistor, respectively.

Figure 3:
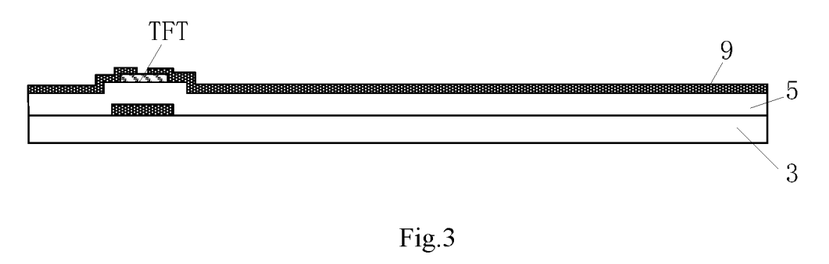
FIG. 3 is a view illustrating manufacturing a thin film transistor and related connection components in a ray detector array substrate according to an embodiment of the present disclosure.
Figure 4:
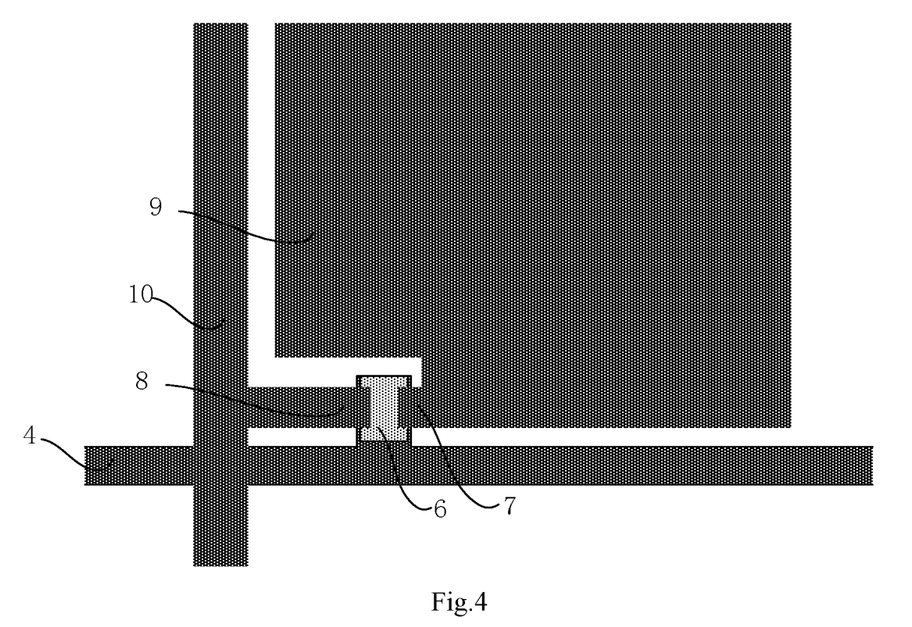
FIG. 4 is a top view corresponding to the sectional view shown in FIG. 3.

Referring to FIG. 3 and FIG. 4, FIG. 3 shows a partial sectional view of the base substrate on which a thin film transistor, a first data line and a receiving electrode are formed, and FIG. 4 illustrates a partial top view of the base substrate corresponding to FIG. 3 on which the thin film transistor is formed. A gate 4 and a gate insulating layer 5 are formed on the base substrate 3 successively, and an active layer 6 connected to the gate 4 is formed. A source 7 and a drain 8 connected to the active layer 6 are then formed, respectively, and the receiving electrode 9 connected to the source 7 and the first data line 10 connected to the drain 8 are formed. In an example, the base substrate 3 is typically a glass substrate, and a main ingredient of the material of the active layer 6 may be amorphous silicon (a-Si).

102. Forming a first passivation layer on the base substrate, the first passivation layer covering the thin film transistor, the first data line and the receiving electrode. The first passivation layer may comprise an inorganic insulating film such as silicon nitride, or an organic insulating film such as a resin material.

103. Forming a first via hole in a region of the first passivation layer corresponding to the first data line, and forming a second via hole in a region of the first passivation layer corresponding to the receiving electrode.

Figure 5:
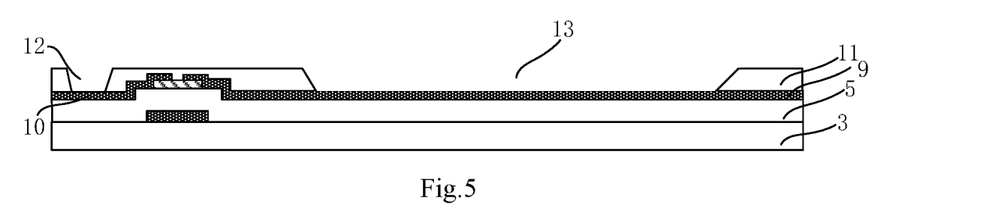
FIG. 5 is a sectional view of an array substrate in which a first via hole and a second via hole are formed during the process of manufacturing a ray detector array substrate according to an embodiment of the present disclosure.

Referring to FIG. 5, which illustrates a sectional view of a ray detector array substrate where the first via hole and the second via hole have been formed in the first passivation layer. A first via hole 12 and a second via hole 13 are formed simultaneously in a first passivation layer 11. The first via hole 12 extends to the first data line 10, and the second via hole 13 extends to the receiving electrode 9. The first via hole and the second via hole are formed in the same layer structure (i.e., the first passivation layer), and the film layers at the first via hole 12 and the second via hole 13 to be formed are the same, so etching rates for etching the two via holes can be the same, which enables a better control to the etching depths to thereby avoid over-etching, and further avoid damage to the first data line and the receiving electrode of the thin film transistor.

104. Forming a photoelectric conversion layer covering the first passivation layer on the base substrate, so that the first via hole and the second via hole are filled with the material of the photoelectric conversion layer.

Figure 6:
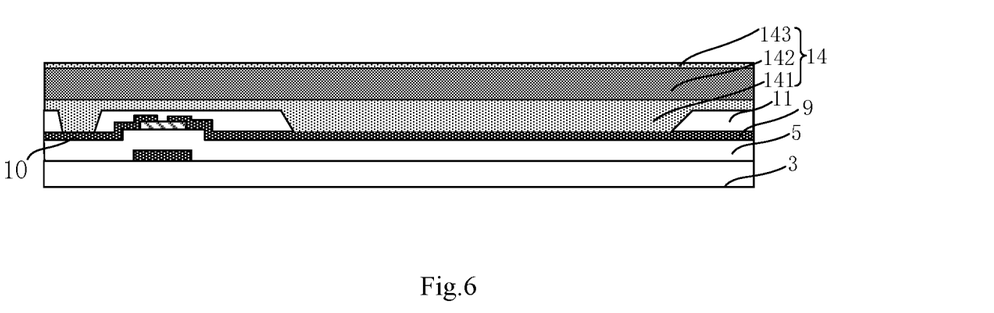
FIG. 6 is a sectional view of a ray detector array substrate in which a photoelectric conversion layer is formed according to an embodiment of the present disclosure.

Referring to FIG. 6, which illustrates a partial sectional view of the ray detector array substrate where the photoelectric conversion layer is formed. A photoelectric conversion layer 14 is formed on the first passivation layer 11, the photoelectric conversion layer 14 covers the first passivation layer 11, and the material of the photoelectric conversion layer is filled into the first via hole and the second via hole.

In an example, the photoelectric conversion layer 14 may comprise N-type amorphous silicon 141, I-type amorphous silicon 142, and P-type amorphous silicon 143 disposed above the base substrate successively, which may be specifically formed by the step of forming N-type amorphous silicon 141, I-type amorphous silicon 142, and P-type amorphous silicon 143 on the first passivation layer 11 successively, the first via hole and the second via hole being filled with the N-type amorphous silicon 141.

105. Etching the photoelectric conversion layer to retain a first portion of the photoelectric conversion layer inside the first via hole, and a second portion of the photoelectric conversion layer above and corresponding to the second via hole.

Figure 7:
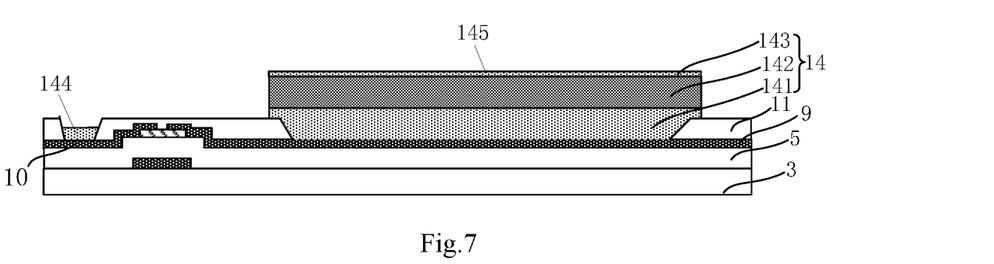
FIG. 7 is a sectional view of a ray detector array substrate in which a first portion and a second portion of the photoelectric conversion layer are formed according to an embodiment of the present disclosure.

Referring to FIG. 7, FIG. 7 is a partial sectional view illustrating the base substrate on which the structures have been formed by performing the step 105 described above. As shown in FIG. 7, by etching the photoelectric conversion layer as shown in FIG. 6, the first portion of the photoelectric conversion layer inside the first via hole and the second portion of the photoelectric conversion layer above and corresponding to the second via hole are retained. In the example of FIG. 7, the first portion of the photoelectric conversion layer in the first via hole is a part of the structure of the photoelectric conversion layer, and the second portion of the photoelectric conversion layer at the second via hole comprises a complete layer structure of the photoelectric conversion layer. The complete layer structure 145 of the photoelectric conversion layer 14 comprises N-type amorphous silicon 141, I-type amorphous silicon 142, and P-type amorphous silicon 143 disposed successively. The first portion 144 of the photoelectric conversion layer 14 inside the first via hole is N-type amorphous silicon.

For the method for manufacturing the array substrate provided by the embodiment of the disclosure, by means of a part (i.e., the first portion) of the photoelectric conversion layer retained in the first via hole above the first data line, it is possible to prevent the first data line from being damaged by over-etching and from being corroded during the etching process in subsequent processes for manufacturing the array substrate.

According to another embodiment of the disclosure, manufacturing the ray detector array substrate further comprises the following steps.

106. Forming a first conductive layer on the second portion of the photoelectric conversion layer.

In an example, the first conductive layer comprises ITO (Indium Tin Oxide), which is a transparent semiconductor conductive film and connected to the P-type amorphous silicon as a top of the photoelectric conversion layer.

107. Forming a resin layer and a second passivation layer successively, the resin layer and the second passivation layer covering the first conductive layer, the first passivation layer, and the first portion of the photoelectric conversion layer. A resin layer is coated on the structure of the array substrate structure where step 106 has been performed, the resin layer can be adhered to the first passivation layer and the first conductive layer through a resin adhesive layer, and then the second passivation layer is coated on the resin layer.

108. Etching the resin layer and the second passivation layer to form a third via hole above the first via hole and form a fourth via hole above the second via hole, the third via hole exposing the first portion of the photoelectric conversion layer in the first via hole, the fourth via hole exposing at least a portion of the first conductive layer.

Figure 8:
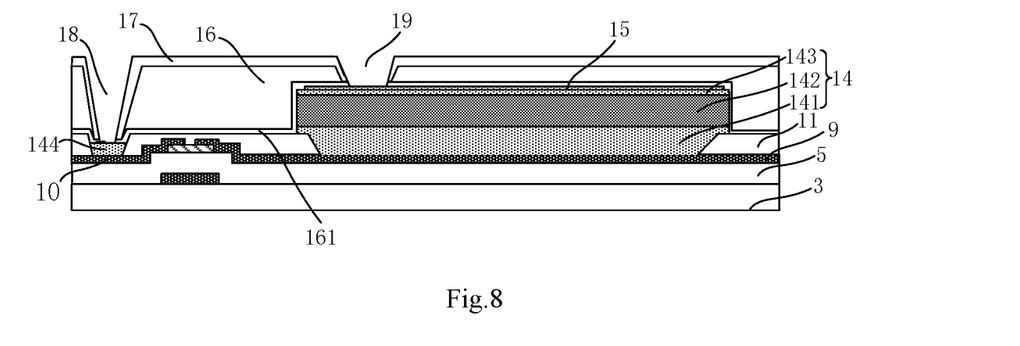
FIG. 8 is a sectional view of a ray detector array substrate in which a third via hole and a fourth via hole are formed according to an embodiment of the present disclosure.
Figure 9:
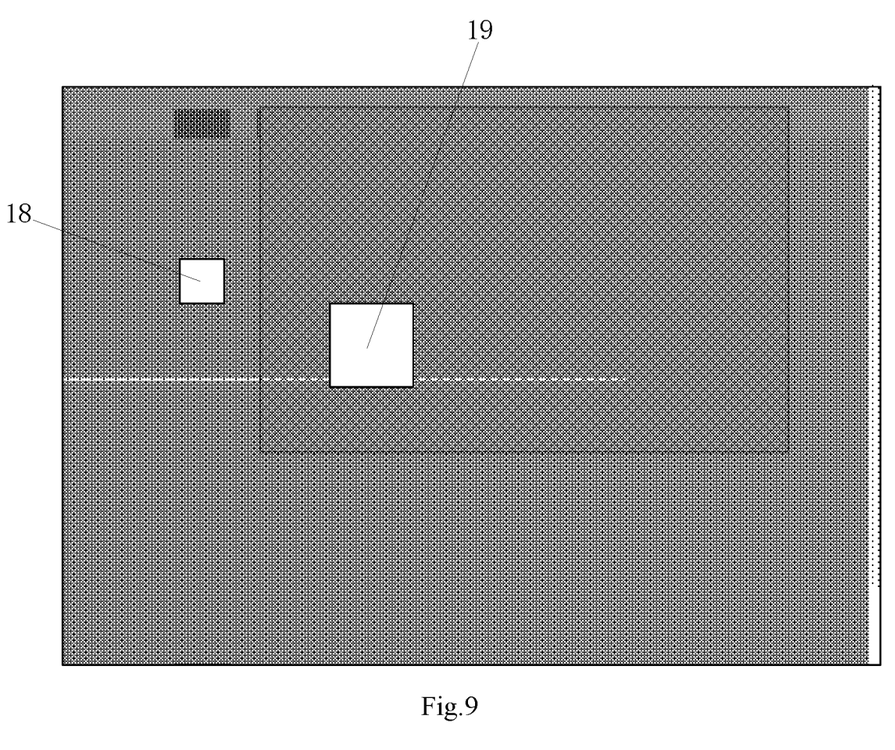
FIG. 9 is a top view of the ray detector array substrate corresponding to FIG. 8.

Referring to FIG. 8 and FIG. 9, FIG. 8 and FIG. 9 provide a partial sectional view and a partial top view of the ray detector array substrate in which a third via hole and a fourth via hole are formed, respectively. After a first conductive layer 15 is formed on the second portion of the photoelectric conversion layer 14, a resin layer 16 and a second passivation layer 17 are coated successively, the resin layer 16 can be adhered to the first passivation layer 11 and the first conductive layer 15 through a resin adhesive layer 161. The resin adhesive layer 161 ensures strong adhesion between the resin layer 16 and its adjacent layers, and then a third via hole 18 and a fourth via hole 19 are formed by an etching process. The third via hole 18 penetrates from the second passivation layer 17 to the first portion 144 of the photoelectric conversion layer, and the fourth via hole 19 penetrates from the second passivation layer 17 to the first conductive layer 15. During the process of etching the third via hole 18 and the fourth via hole 19, since the materials of the film layers at the third via hole 18 and the fourth via hole 19 to be formed are the same (both of which are the material of the second passivation layer), the etching rates for etching the two holes can be the same, which can achieve a better control to the etching depths. In addition, the first portion 144 of the photoelectric conversion layer can effectively prevent the first data line 10 from being damaged by over-etching that is likely to occur when the third via hole 18 is being formed, and the first portion 144 of the photoelectric conversion layer can prevent the first data line 10 from being corroded during the etching process. Since the first portion 144 of the photoelectric conversion layer is conductive, electrical connections of the first data line 10 to other lines through the third via hole 18 would not be affected.

In other words, by retaining a part of the photoelectric conversion layer inside the first via hole above the first data line, it is possible to prevent the first data line from being damaged by over-etching that is likely to occur during the subsequent process of fabricating the third via hole and the fourth via hole, and it is also possible to prevent the first data line from being corroded. Moreover, during the process of etching the third via hole and the fourth via hole, the materials of the film layers to be etched are the same (i.e., the second passivation layer), a same etching rate can be used to etch the two holes, which can achieve a better control to etching depths, reducing or avoiding the possibility of forming chamfered structures and poor connections.

Figure 10:
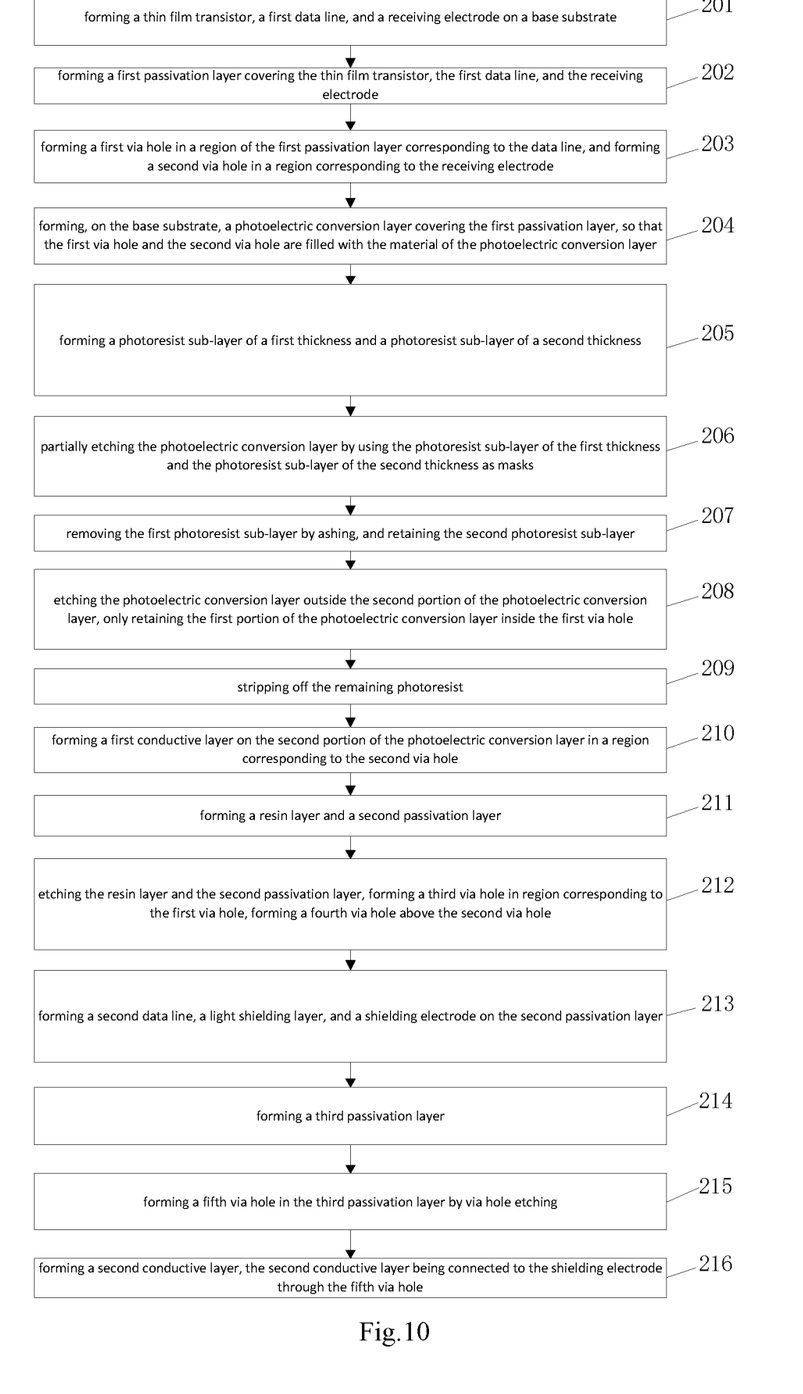
FIG. 10 is a flow chart of a method for manufacturing a ray detector array substrate according to another embodiment of the present disclosure.

FIG. 10 illustrates an exemplary flow chart of a method for manufacturing a ray detector array substrate according to another embodiment of the disclosure. As shown in FIG. 10, another embodiment of the disclosure provides a method of manufacturing an array substrate, comprising: 201, forming a thin film transistor, a first data line, and a receiving electrode on a base substrate; 202, forming, on the base substrate, a first passivation layer covering the thin film transistor, the first data line, and the receiving electrode; 203, forming a first via hole in a region of the first passivation layer corresponding to the first data line, and forming a second via hole in a region of the first passivation layer corresponding to the receiving electrode; 204, forming, on the base substrate, a photoelectric conversion layer covering the first passivation layer, so that the first via hole and the second via hole are filled with the material of the photoelectric conversion layer.

For details of the foregoing steps 201 to 204, reference may be made to the corresponding descriptions to step 101 and step 104 in FIG. 2 respectively, which are not described here again. Subsequent steps of the manufacturing method according to the embodiment of the present disclosure will be specifically described below.

According to an embodiment of the disclosure, the above-mentioned step 105 comprises the following processes: forming, on the photoelectric conversion layer covering the first passivation layer, a first photoresist sub-layer having a first thickness and a second photoresist sub-layer having a second thickness, the second thickness being greater than the first thickness, the first photoresist sub-layer corresponding to the first via hole, the second photoresist sub-layer corresponding to the second via hole; etching regions of the photoelectric conversion layer that are not covered by the first photoresist sub-layer and the second photoresist sub-layer, so that the thickness of the photoelectric conversion layer in the regions is reduced by a preset value; performing ashing treatment on the first photoresist sub-layer and the second photoresist sub-layer to remove the first photoresist sub-layer and reduce the thickness of the second photoresist sub-layer; etching the photoelectric conversion layer outside the region of the second photoresist sub-layer at the same etching rate, only retaining the first portion of the photoelectric conversion layer inside the first via hole.

According to an embodiment of the disclosure, the step of forming a first photoresist sub-layer having a first thickness and a second photoresist sub-layer having a second thickness comprises: forming a photoresist layer with a uniform thickness on the photoelectric conversion layer covering the first passivation layer, the photoresist layer covering the photoelectric conversion layer; performing a half-tone mask exposure process on the photoresist layer, forming the first photoresist sub-layer above the first via hole, forming the second photoresist sub-layer above the second via hole.

For example, as shown in FIG. 10, in step 205, a photoresist of an equal thickness covering the entire photoelectric conversion layer is formed on the photoelectric conversion layer above the base substrate as shown in FIG. 6, by performing a half-tone mask exposure process, a photoresist sub-layer of a first thickness is formed in a region corresponding to the first via hole, and a photoresist sub-layer of a second thickness is formed in a region corresponding to the second via hole, the second thickness being greater than the first thickness, and the photoresist in other regions is removed.

Figure 11:
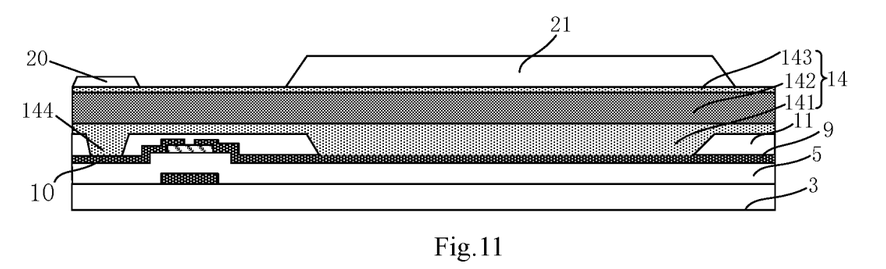
FIG. 11 illustrates a first photoresist sub-layer and a second photoresist sub-layer fabricated during the process of manufacturing a ray detector array substrate according to an embodiment of the present disclosure.

Referring to FIG. 11, FIG. 11 provides a sectional view of the ray detector array substrate where a first photoresist sub-layer and a second photoresist sub-layer have been formed. A first photoresist sub-layer 20 (a photoresist of a first thickness) and a second photoresist sub-layer 21 (a photoresist of a second thickness) having different thicknesses are formed on the photoelectric conversion layer 14 by a half-tone mask exposure process. The first photoresist sub-layer 20 is above the first via hole and covers the first via hole. The second photoresist sub-layer 21 is above the second via hole and covers the second via hole. The thickness of the first photoresist sub-layer 20 is less than that of the second photoresist sub-layer 21. Etching is then performed. During the etching process, portions covered by the first photoresist sub-layer 20 and the second photoresist sub-layer 21 will not be etched away. The first photoresist sub-layer 20 is relatively thin and the second photoresist sub-layer 21 is relatively thick, which enables that the second photoresist sub-layer 21 is only partially removed by ashing and partially retained when the first photoresist sub-layer 20 is removed by ashing in subsequent steps. The remaining second photoresist sub-layer 21 is still located above the second via hole and covers the second via hole to ensure subsequent etching.

206. Etching regions of the photoelectric conversion layer not covered by the photoresist by using the photoresist sub-layer of the first thickness and the photoresist sub-layer of the second thickness as masks, so that the thickness of the photoelectric conversion layer in the regions is reduced by a preset value.

Figure 12:
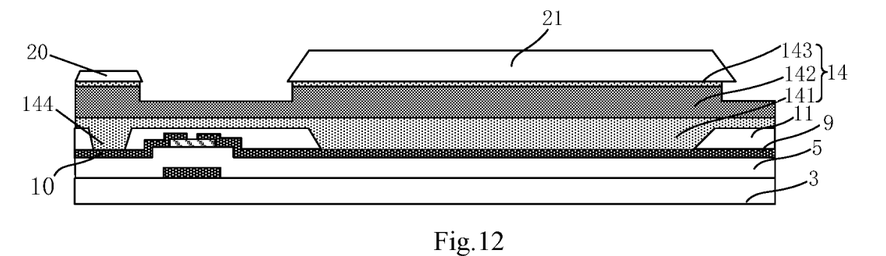
FIG. 12 illustrates a process of partially etching the photoelectric conversion layer in the structure shown in FIG. 11.

Referring to FIG. 12, which illustrates an example of a sectional view of the ray detector array substrate where the photoelectric conversion layer is etched by a preset thickness. As shown in FIG. 12, after partially etching the regions of the photoelectric conversion layer not covered by the photoresist, the thickness of the photoelectric conversion layer above the first via hole is greater than the thickness of the portions of the photoelectric conversion layer not provided with the first photoresist sub-layer 20 and the second photoresist sub-layer 21, so as to ensure a part (e.g., the first portion 144) of the photoelectric conversion layer is retained inside the first via hole during subsequent etching.

In an embodiment, the preset value mentioned above is ⅓ of the thickness of the photoelectric conversion layer. The photoelectric conversion layer 14 may comprise N-type amorphous silicon 141, I-type amorphous silicon 142, and P-type amorphous silicon 143 which are disposed successively, and the photoelectric conversion layer is etched by ⅓ of the thickness thereof. In an example, the P-type amorphous silicon 143 and the I-type amorphous silicon 142 in the photoelectric conversion layer not covered by the first photoresist sub-layer 20 and the second photoresist sub-layer 21 are partially etched away.

207. Removing the first photoresist sub-layer of the first thickness by ashing, and retaining a portion of the second photoresist sub-layer.

Figure 13:
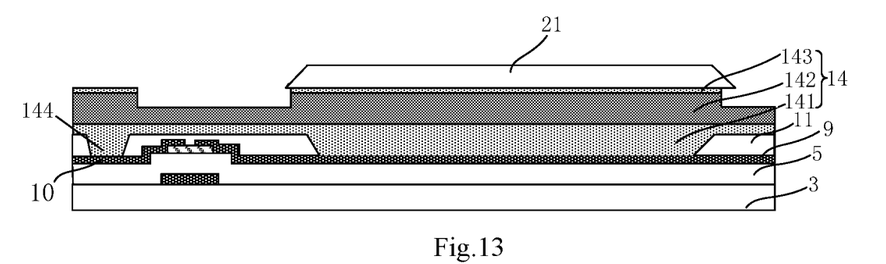
FIG. 13 illustrates removal of part of the photoresist by ashing.

Referring to FIG. 13, it is a sectional view of the ray detector array substrate where the first photoresist sub-layer is removed by ashing. When the first photoresist sub-layer is removed by ashing, the second photoresist sub-layer 21 is also partially removed by ashing. Since the second photoresist sub-layer 21 is thicker than the first photoresist sub-layer, the second photoresist sub-layer 21 is partially retained after the first photoresist sub-layer is removed by ashing, so that the portion of the photoelectric conversion layer covered by the second photoresist sub-layer 21 will not be etched away during subsequent etching.

208. Etching the photoelectric conversion layer outside the region of the second photoresist sub-layer at the same etching rate, completely etching away the photoelectric conversion layer on the thin film transistor, while only retaining part of the photoelectric conversion layer inside the first via hole.

After step 207 is performed, the photoelectric conversion layer outside the region of the second photoresist sub-layer is etched at the same etching rate, and only the first portion of the photoelectric conversion layer in the first via hole is retained.

209. Stripping off the remaining photoresist.

After step 208 is performed, referring to FIG. 13, the second photoresist sub-layer 21 still remains, and then step 209 is performed to strip off the remaining photoresist, so the array substrate having a sectional view as shown in FIG. 7 is obtained. Wet etching may be employed to etch away the remaining photoresist.

210. Forming a first conductive layer on the second portion of the photoelectric conversion layer corresponding to the second via hole.

211. Forming a resin layer and a second passivation layer successively, the resin layer and the second passivation layer covering the first conductive layer, the first passivation layer, and the first portion of the photoelectric conversion layer.

212. Etching the resin layer and the second passivation layer, forming, above the first via hole, a third via hole exposing the first portion of the photoelectric conversion layer inside the first via hole, forming, above the second via hole, a fourth via hole exposing at least a portion of the first conductive layer.

For details of steps 210 to 212, reference may be made to the corresponding descriptions to steps 106 and 108 in FIG. 2, respectively. The related specific structures are shown in FIG. 8 and FIG. 9 and will not be repeated herein.

213. Forming a second data line, a light shielding layer, and a shielding electrode on the second passivation layer, the second data line being electrically connected to the first portion of the photoelectric conversion layer through the third via hole, the light shielding layer corresponding to the active layer of the thin film transistor, the shielding electrode being electrically connected to the first conductive layer through the fourth via hole.

Figure 14:
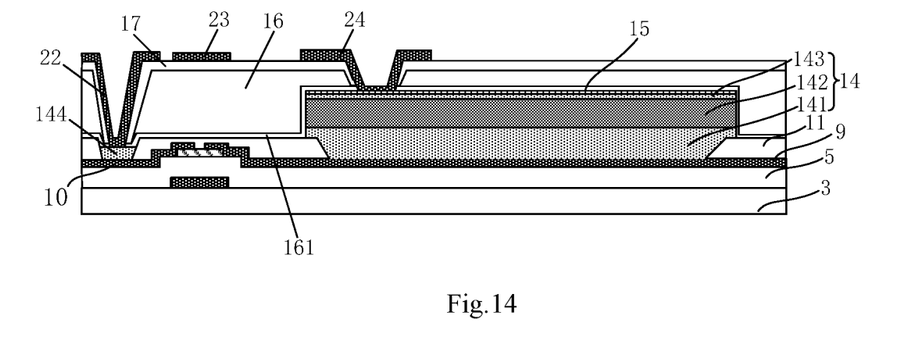
FIG. 14 is a sectional view of a ray detector array substrate in which a second data line, a light shielding layer, and a shielding electrode are formed according to another embodiment of the present disclosure.

Referring to FIG. 14, FIG. 14 provides a partial sectional view of the ray detector array substrate where a second data line, a light shielding layer, and a shielding electrode are formed. The second data line 22 is electrically connected to the first portion 144 of the photoelectric conversion layer through the third via hole, the light shielding layer 23 is located above the active layer of the thin film transistor and covers the active layer, and the shielding electrode 24 is electrically connected to the first conductive layer 15 through the fourth via hole.

214. Forming a third passivation layer so that the third passivation layer covers the second passivation layer on which the second data line, the light shielding layer, and the shielding electrode have been formed.

In an embodiment of the disclosure, the third passivation layer may comprise an inorganic insulating film such as silicon nitride, or an organic insulating film such as a resin material.

215. Forming a fifth via hole in the third passivation layer, the fifth via hole exposing at least a portion of the shielding electrode.

The process for etching the fifth via hole only involves a single film layer, so the etching rate can be constant, which is helpful to achieve a better control to etching depth, so as to prevent the shielding electrode from being damaged by over-etching.

216. Forming a second conductive layer on the third passivation layer, the second conductive layer being connected to the shielding electrode through the fifth via hole.

Figure 15:
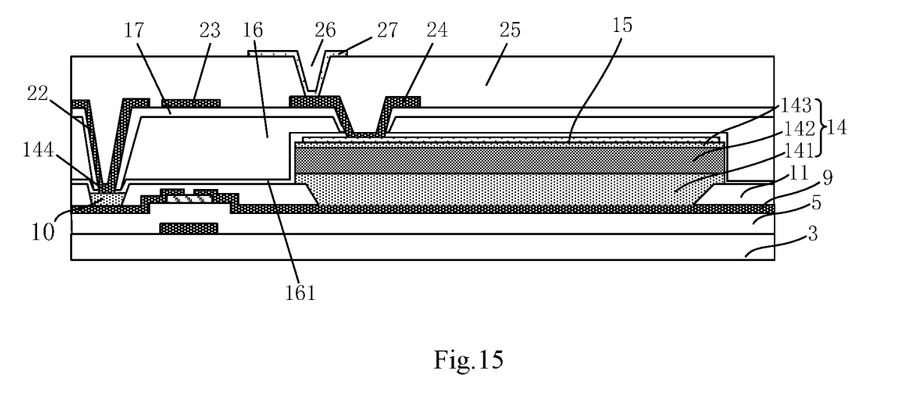
FIG. 15 is a sectional view of a ray detector array substrate in which a second conductive layer is formed according to a further embodiment of the present disclosure.

Referring to FIG. 15, which illustrates a partial sectional view of the ray detector array substrate where the second conductive layer is formed. After the second data line 22, the light shielding layer 23 and the shielding electrode 24 are formed, a third passivation layer 25 is formed, a fifth via hole 26 is then formed in the third passivation layer 25 by via hole etching, and then a second conductive layer 27 is formed. The second conductive layer 27 is connected to the shielding electrode 24 through the fifth via hole 26. The second conductive layer 27 comprises ITO, which is connected to the shielding electrode 24.

With the method for manufacturing the array substrate provided by the embodiment of the disclosure, a first photoresist sub-layer and a second photoresist sub-layer are formed by a half-tone mask exposure technique, the thickness of the first photoresist sub-layer is less than that of the second photoresist sub-layer, and the first photoresist sub-layer is located above the first data line. By etching the photoelectric conversion layer such that the photoelectric conversion layer above the first data line is thicker than the photoelectric conversion layer in other regions not covered by the photoresist. After the first photoresist sub-layer is removed by ashing, etching is performed on the photoelectric conversion layer, so that part (i.e., the first portion) of the photoelectric conversion layer is retained inside the first via hole, which ensures that, during the etching process of forming the third via hole and the fourth via hole, the first portion of the photoelectric conversion layer can prevent the first data line from being damaged by over-etching that is likely to occur and from being corroded during the etching process. In addition, the first via hole, the second via hole, the third via hole or the fourth via hole are formed in the same film layer respectively, thus a uniform etching rate can be maintained, so that the etching depth can be better controlled, which is advantageous for reducing or avoiding formation of chamfered structures and occurrence of poor connections.

A further embodiment of the disclosure provides a ray detector array substrate comprising: a base substrate, and a thin film transistor, a first data line and a receiving electrode on the base substrate, the first data line and the receiving electrode being electrically connected to a source or drain of the thin film transistor, respectively; a first passivation layer that is disposed on the base substrate and covers the thin film transistor, the first passivation layer being provided with a first via hole and a second via hole, the first via hole corresponding to a region of the first data line, the second via hole corresponding to a region of the receiving electrode; a photoelectric conversion layer, the photoelectric conversion layer comprising a first portion in the first via hole and a second portion in the second via hole, the first portion being electrically connected to the first data line, and the second portion being electrically connected to the receiving electrode. As shown in FIG. 3 to FIG. 9, the ray detector array substrate provided by the embodiment of the disclosure comprises: a base substrate 3, and a thin film transistor, a first data line 10 and a receiving electrode 9 disposed on the base substrate 3, the thin film transistor comprising a gate 4, a gate insulating layer 5, an active layer 6, a source 7, and a drain 8; a first passivation layer 11, which is disposed on the base substrate 3 and covers the thin film transistor, the first passivation layer 11 being provided with a first via hole 12 and a second via hole 13, the first via hole 12 corresponding to a region of the first data line 10, the second via hole 13 corresponding to a region of the receiving electrode 9; a photoelectric conversion layer, which comprises a first portion 144 inside the first via hole 12 and a second portion 145 in the second via hole, the first portion being electrically connected to the first data line 10, and the second portion is electrically connected to the receiving electrode 9.

According to another embodiment of the disclosure, the ray detector array substrate further comprises: a first conductive layer 15, which is disposed on a side of the second portion 145 of the photoelectric conversion layer 14 facing away the receiving electrode 9; a resin layer 16 covering the first conductive layer, the first passivation layer, and the first portion of the photoelectric conversion layer, and a second passivation layer 17 above the resin layer. The second passivation layer 17 is provided with a third via hole 18 and a fourth via hole 19, the third via hole 18 penetrates to the first portion of the photoelectric conversion layer in the thickness direction of the resin layer, and the fourth via hole 19 penetrates to the first conductive layer 15 in the thickness direction of the resin layer. At the time of fabricating the thin film transistor, a gate 4 and a gate insulating layer 5 may be formed on the base substrate 3 successively, and an active layer 6 connected to the gate 4 is formed, then a source 7 and a drain 8 connected to the active layer 6 are formed respectively, and a receiving electrode 9 connected to the source 7 and a first data line 10 connected to the drain 8 are formed. In an embodiment of the disclosure, the base substrate 3 may be a glass substrate, and the main ingredient of the material of the active layer 6 may comprise amorphous silicon. The first passivation layer 11 may comprise an inorganic insulating film, such as silicon nitride, or an organic insulating film, such as a resin material. In an embodiment of the disclosure, the first conductive layer 15 may comprise ITO, which is a transparent semiconductor conductive film and electrically connected to the second portion 145 of the photoelectric conversion layer.

For the array substrate provided by the embodiment of the disclosure, part (e.g. the first portion) of the photoelectric conversion layer is retained inside the first via hole above the first data line, so that when the third via hole and the fourth via hole are being formed, this part of the photoelectric conversion layer can prevent the first data line from being damaged by over-etching that is likely to occur and from being corroded during the etching process. In addition, during the process of forming the first via hole and the second via hole, and the process of forming the third via hole and the fourth via hole, each of them is formed by etching in a single film layer, so a constant etching rate is possible, which enables a better control to the etching depth, and can effectively avoid chamfering, poor connections, etc. resulting from over-etching.

Further, as shown in FIG. 15, according to another embodiment of the disclosure, the array substrate further comprises a second data line 22, a light shielding layer 23, and a shielding electrode 24 disposed on the second passivation layer 17, the second data line 22 being electrically connected to the first portion 144 of the photoelectric conversion layer 14 through the third via hole 18, the light shielding layer 23 corresponding to the active layer 6 of the thin film transistor, the shielding electrode 24 being electrically connected to the first conductive layer 15 through the fourth via hole 19; a third passivation layer 25, the third passivation layer covering the second passivation layer, and the second data line 22, the light shielding layer 23 and the shielding electrode 24 on the second passivation layer, the third passivation layer being provided with a fifth via hole 26; and a second conductive layer 27 electrically connected to the shielding electrode through the fifth via hole. In an embodiment of the disclosure, the third passivation layer 25 may comprise an inorganic insulating film, such as silicon nitride, or an organic insulating film, such as a resin material; the second conductive layer 27 may comprise ITO, which is connected to the shielding electrode 24.

According to an embodiment of the disclosure, the photoelectric conversion layer comprises N-type amorphous silicon 141, I-type amorphous silicon 142, and P-type amorphous silicon 143, which are disposed on the first passivation layer successively. The first portion of the photoelectric conversion layer is N-type amorphous silicon.

In another embodiment, the resin layer 16 is adhered to the first passivation layer 11 and the first conductive layer 15 through a resin adhesive layer 161. The resin adhesive layer 161 ensures adhesion between the resin layer 16 and its adjacent layers.

An embodiment of the disclosure further provides a ray detector, comprising the ray detector array substrate described above.

An embodiment of the disclosure further provides a ray detector array substrate, which is manufactured by means of any one of the embodiments of a method for manufacturing a ray detector array substrate described above.

For the ray detector provided by the embodiment of the disclosure, part (e.g., the first portion described above) of the photoelectric conversion layer is retained inside the first via hole above the first data line in the array substrate, so that during the process of forming the third via hole and the fourth via hole, the first portion of the photoelectric conversion layer can prevent the first data line from being damaged by over-etching and from being corroded during the etching process. Moreover, each of the first via hole, the second via hole, the third via hole and the fourth via hole is formed by an etching process in a same film layer, thus a uniform etching rate can be achieved, so that the etching depth can be better controlled, which is advantageous for avoiding occurrence of chamfering and poor connections resulting from over-etching.

What have been stated above are only some of the embodiments of the disclosure, and are not intended to limit the embodiments of the present disclosure in any way. Any simple amendments, equivalent variations, and modifications made to the embodiments herein consistent with the technical essence of the disclosure fall within the protection scope of the application.

The invention claimed is:

1. A method for manufacturing a ray detector array substrate, comprising:
    forming a thin film transistor, a first data line and a receiving electrode on a base substrate, the first data line and the receiving electrode being electrically connected to a source or a drain of the thin film transistor, respectively;
    forming a first passivation layer on the base substrate, the first passivation layer covering the thin film transistor, the first data line, and the receiving electrode;
    forming a first via hole and a second via hole in regions of the first passivation layer corresponding to the first data line and the receiving electrode, respectively;
    forming a photoelectric conversion layer covering the first passivation layer on the base substrate, the first via hole and the second via hole being filled with a material of the photoelectric conversion layer, and
    etching the photoelectric conversion layer to retain a first portion of the photoelectric conversion layer inside the first via hole, and a second portion of the photoelectric conversion layer above and corresponding to the second via hole.

2. The method according to claim 1, further comprising:
    forming a first conductive layer on the second portion of the photoelectric conversion layer;
    forming a resin layer and a second passivation layer successively, the resin layer and the second passivation layer covering the first conductive layer, the first passivation layer, and the first portion of the photoelectric conversion layer;
    etching the resin layer and the second passivation layer to form a third via hole above the first via hole, and form a fourth via hole above the second via hole, the third via hole exposing the first portion of the photoelectric conversion layer in the first via hole, and the fourth via hole exposing at least a portion of the first conductive layer.

3. The method according to claim 1, wherein the etching the photoelectric conversion layer to retain the first portion of the photoelectric conversion layer inside the first via hole, and a second portion of the photoelectric conversion layer above and corresponding to the second via hole comprises:
    forming, on the photoelectric conversion layer covering the first passivation layer, a first photoresist sub-layer having a first thickness and a second photoresist sub-layer having a second thickness, respectively, the second thickness being greater than the first thickness, the first photoresist sub-layer corresponding to the first via hole, the second photoresist sub-layer corresponding to the second via hole;
    etching regions of the photoelectric conversion layer not covered by the first photoresist sub-layer and the second photoresist sub-layer, so that a thickness of the photoelectric conversion layer in the regions is reduced by a preset value;
    performing ashing treatment on the first photoresist sub-layer and the second photoresist sub-layer to remove the first photoresist sub-layer and reduce a thickness of the second photoresist sub-layer, and
    etching the photoelectric conversion layer outside the second photoresist sub-layer at a same etching rate to only retain the first portion of the photoelectric conversion layer inside the first via hole.

4. The method according to claim 3, wherein the forming the first photoresist sub-layer having the first thickness and the second photoresist sub-layer having the second thickness comprises:
    forming a photoresist layer with a uniform thickness on the photoelectric conversion layer covering the first passivation layer, the photoresist layer covering the photoelectric conversion layer, and
    performing a half-tone mask exposure process on the photoresist layer to form the first photoresist sub-layer above the first via hole, and form the second photoresist sub-layer above the second via hole.

5. The method according to claim 3, wherein the preset thickness is ⅓ of a thickness of the photoelectric conversion layer.

6. The method according to claim 2, further comprising:
    forming a second data line, a light shielding layer and a shielding electrode on the second passivation layer, the second data line being electrically connected to the first portion of the photoelectric conversion layer through the third via hole, the light shielding layer corresponding to an active layer of the thin film transistor, the shielding electrode being electrically connected to the first conductive layer through the fourth via hole;
    forming a third passivation layer, the third passivation layer covering the second passivation layer on which the second data line, the light shielding layer, and the shielding electrode have been formed;
    forming a fifth via hole in the third passivation layer, the fifth via hole exposing at least a part of the shielding electrode, and
    forming a second conductive layer on the third passivation layer, the second conductive layer being connected to the shielding electrode through the fifth via hole.

7. The method according to claim 1, wherein the forming the photoelectric conversion layer covering the first passivation layer on the base substrate comprises:
    forming N-type amorphous silicon, I-type amorphous silicon, and P-type amorphous silicon successively on the first passivation layer, the first via hole and the second via hole being filled with the N-type amorphous silicon.

8. A ray detector array substrate comprising:
    a base substrate, and a thin film transistor, a first data line, and a receiving electrode on the base substrate, the first data line and the receiving electrode being electrically connected to a source or a drain of the thin film transistor, respectively;
    a first passivation layer disposed on the base substrate and covering the thin film transistor, the first passivation layer comprising a first via hole and a second via hole, the first via hole corresponding to a region of the first data line, the second via hole corresponding to a region of the receiving electrode, and
    a photoelectric conversion layer, the photoelectric conversion layer comprising a first portion in the first via hole and a second portion in the second via hole, the first portion being electrically connected to the first data line, the second portion being electrically connected to the receiving electrode.

9. The ray detector array substrate according to claim 8, further comprising:

a first conductive layer disposed on a side of the second portion of the photoelectric conversion layer facing away the receiving electrode;

a resin layer covering the first conductive layer, the first passivation layer and the first portion of the photoelectric conversion layer, and a second passivation layer above the resin layer, wherein the resin layer and the second passivation layer comprise a third via hole and a fourth via hole, the third via hole penetrating to the first portion of the photoelectric conversion layer in a thickness direction of the resin layer, the fourth via hole penetrating to the first conductive layer in the thickness direction of the resin layer.

10. The ray detector array substrate according to claim 9, further comprising:

a second data line, a light shielding layer and a shielding electrode disposed on the second passivation layer, the second data line being electrically connected to the first portion of the photoelectric conversion layer through the third via hole, the light shielding layer corresponding to an active layer of the thin film transistor, the shielding electrode being electrically connected to the first conductive layer through the fourth via hole;

a third passivation layer, the third passivation layer covering the second passivation layer, and the second data line, the light shielding layer and the shielding electrode on the second passivation layer, the third passivation layer comprises a fifth via hole, and a second conductive layer, the second conductive layer being electrically connected to the shielding electrode through the fifth via hole.

11. The ray detector array substrate according to claim 8, wherein the photoelectric conversion layer comprises N-type amorphous silicon, I-type amorphous and P-type amorphous silicon disposed on the first passivation layer successively, and the first portion of the photoelectric conversion layer comprises the N-type amorphous silicon.

12. The ray detector array substrate according to claim 11, wherein the resin layer is adhered to the first passivation layer and the first conductive layer through a resin adhesive layer.

13. A ray detector, comprising the ray detector array substrate according to claim 8.

14. A ray detector array substrate manufactured by the method according to claim 1.

15. The ray detector according to claim 13, wherein the ray detector array substrate further comprising:

a first conductive layer disposed on a side of the second portion of the photoelectric conversion layer facing away the receiving electrode;

a resin layer covering the first conductive layer, the first passivation layer and the first portion of the photoelectric conversion layer, and a second passivation layer above the resin layer, wherein the resin layer and the second passivation layer comprise a third via hole and a fourth via hole, the third via hole penetrating to the first portion of the photoelectric conversion layer in a thickness direction of the resin layer, the fourth via hole penetrating to the first conductive layer in the thickness direction of the resin layer.

16. The ray detector according to claim 15, wherein the ray detector array substrate further comprises:

a second data line, a light shielding layer and a shielding electrode disposed on the second passivation layer, the second data line being electrically connected to the first portion of the photoelectric conversion layer through the third via hole, the light shielding layer corresponding to an active layer of the thin film transistor, the shielding electrode being electrically connected to the first conductive layer through the fourth via hole;

a third passivation layer, the third passivation layer covering the second passivation layer, and the second data line, the light shielding layer and the shielding electrode on the second passivation layer, the third passivation layer comprises a fifth via hole, and a second conductive layer, the second conductive layer being electrically connected to the shielding electrode through the fifth via hole.

17. The ray detector according to claim 13, wherein the photoelectric conversion layer comprises N-type amorphous silicon, I-type amorphous and P-type amorphous silicon disposed on the first passivation layer successively, and the first portion of the photoelectric conversion layer comprises the N-type amorphous silicon.

18. The ray detector according to claim 17, wherein the resin layer is adhered to the first passivation layer and the first conductive layer through a resin adhesive layer.

* * * * *